(12) United States Patent
Lu et al.

(10) Patent No.: US 8,816,743 B1
(45) Date of Patent: Aug. 26, 2014

(54) CLOCK STRUCTURE WITH CALIBRATION CIRCUITRY

(71) Applicant: Altera Corporation, San Jose, CA (US)

(72) Inventors: Sean Shau-Tu Lu, San Jose, CA (US); Yan Chong, San Jose, CA (US); Kin Hong Au, Pulau Pinang (MY); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/749,450

(22) Filed: Jan. 24, 2013

(51) Int. Cl.
*H03K 3/013* (2006.01)

(52) U.S. Cl.
USPC .......................................................... 327/292

(58) Field of Classification Search
CPC .......................................................... G06F 1/10
USPC .......................................................... 327/292
See application file for complete search history.

(56) References Cited

U.S. PATENT DOCUMENTS

| | | | |
|---|---|---|---|
| 8,264,906 B2 | 9/2012 | Chiu | |
| 8,294,501 B1 | 10/2012 | Thomas et al. | |
| 8,339,895 B2 | 12/2012 | Ware et al. | |
| 2011/0158031 A1* | 6/2011 | Ware et al. | ............... 365/233.11 |
| 2012/0223757 A1 | 9/2012 | Camp | |

* cited by examiner

*Primary Examiner* — Daniel Rojas

(57) ABSTRACT

An integrated circuit includes a clock circuit that may be used to provide clock signals to multiple input-output circuits. The integrated circuit may also include different clock structures. As an example, one of the clock structures may have multiple clock paths of substantially equal lengths while another clock structure may have a fly-by clock path. The multiple clock paths may be used to convey a subset of the clock signals to the input-output circuits. Similarly, the fly-by clock path may be used to transmit a second subset of the clock signals to the input-output circuits.

20 Claims, 9 Drawing Sheets

```
D7 D6 D5 D4 D3 D2 D1 D0  |  sel [2:0]
-------------------------|------------
 0  0  0  0  0  0  0  1  |   0  0  0
 0  0  0  0  0  0  1  0  |   0  0  1
 0  0  0  0  0  1  0  0  |   0  1  0
 0  0  0  0  1  0  0  0  |   0  1  1
 0  0  0  1  0  0  0  0  |   1  0  0
 0  0  1  0  0  0  0  0  |   1  0  1
 0  1  0  0  0  0  0  0  |   1  1  0
 1  0  0  0  0  0  0  0  |   1  1  1
```

CLOCK STRUCTURE WITH CALIBRATION CIRCUITRY

BACKGROUND

Integrated circuit devices, such as field-programmable gate arrays (FPGAs) and application specific integrated circuits (ASICs), may include circuits or logic blocks that can be used to perform any of a variety of functions. For example, input-output circuitry may be used to interface with external circuitry. As signals need to be transmitted to different circuit elements or blocks in an integrated circuit (IC) device, clock circuitry may be included in most IC devices to provide clock signals that may be used to synchronize the different circuit elements in the IC device.

To ensure proper synchronization, a balanced clock structure is generally needed to minimize clock skew when the clock signals are transmitted from one block to another in the IC (e.g., from a clock source to an input-output block). Generally, multiple metal traces may be needed to route all the different clock signals with a balanced clock structure such as an H-tree clock structure.

Input-output blocks implementing a double data rate (DDR) interface, for instance, may require up to five different clock signals (e.g., a half-rate clock and four full-rate phase-shifted clocks). Accordingly, in order to route five different clock signals through a six-layer balanced clock tree, a total of thirty (5 clock signals×6 clock tree layers) metal traces may be needed. These metal traces may occupy valuable space/area in the IC device.

An unbalanced clock structure may require fewer metal traces. For instance, a fly-by clock structure may require as few as five metal traces to route five clocks. However, routing clock signals through unbalanced clock structures may potentially cause clock skew between different circuit elements or blocks on the IC device.

SUMMARY

Circuitry and techniques for routing and calibrating clock signals in an integrated circuit are provided. Embodiments of the present invention include circuits and techniques to route clock signals through different clock structures.

It is appreciated that the present invention can be implemented in numerous ways, such as a process, an apparatus, a system, or a device. Several inventive embodiments of the present invention are described below.

An integrated circuit may include a clock circuit that may be used to provide clock signals to logic circuits on the integrated circuit. For example, the clock signals may be provided to multiple input-output circuits on the integrated circuit. The integrated circuit may also include different clock structures to route the clock signals. As an example, a first clock structure may have multiple clock paths while a second clock structure may have a single clock path (e.g., a fly-by clock path that transmits the clock signals to each of the input-output circuits linearly). The clock signals generated by the clock circuit may be conveyed through the clock structures. As an example, a first subset of the clock signals may be transmitted to input-output circuits through the multiple clock paths of a first clock structure while a second subset of the clock signals may be transmitted through the fly-by clock path of a second clock structure.

An integrated circuit may include a first clock network that may be used to convey a reference clock signal and a second clock network that may be used to convey multiple phase-shifted clock signals (e.g., clock signals that are phase-shifted from the reference clock signal). The reference clock signal and phase-shifted clock signals may be provided to logic circuits such as input-output circuits. The logic circuits may be provided with respective selection circuits that each receive the reference clock signal and the phase-shifted clock signals from the clock networks. The selection circuits may select one of the phase-shifted clock signals based on the reference clock signal. For example, the selection circuit for each input-output circuit may determine which phase-shifted clock signal matches the reference clock signal at that input-output circuit. A detection circuit may be provided for each input-output circuit along with the selection circuits. The detection circuit may be used to detect any remaining delay mismatch between the reference clock and the selected phase-shifted clock signal. The detection circuit may be used to control adjustable delay circuitry to reduce the delay mismatch between the reference clock and the selected phase-shifted clock signals.

A method of operating circuitry on an integrated circuit includes receiving a reference clock signal from a balanced clock structure with the circuitry. Multiple clock signals may also be received with the circuitry from a fly-by clock structure. The clock signals may be phase shifted from each other. A clock signal is identified from the multiple clock signals using the circuitry. The phase of the identified clock signal may correspond to the phase of the reference clock signal.

DETAILED DESCRIPTION

The embodiments provided herein include circuitry and techniques to route and calibrate clock signals in an integrated circuit.

It will be obvious, however, to one skilled in the art, that the present exemplary embodiments may be practiced without some or all of these specific details. In other instances, well-known operations have not been described in detail in order not to unnecessarily obscure the present embodiments.

Integrated circuit (IC) devices generally use a clock signal to synchronize different circuit elements in the device. Accordingly, different clock structures may be formed to route clock signals to different parts of the IC. A balanced clock structure may minimize clock skew and as such, is generally preferred. However, a balanced clock structure may be more complex and may require more metal traces to implement. Compared to a balanced clock structure, an unbalanced clock structure may require relatively fewer metal traces but may increase clock skew considerably.

One of the embodiments described herein provides a technique for routing clock signals through an unbalanced clock structure and calibrating the clock signals with calibration circuitry. In one of the embodiments, a portion of the clock signals may be routed through the unbalanced clock structure while another portion of the clock signals may be routed through a balanced clock structure. However, an unbalanced clock structure may adversely affect circuit operation (e.g., the circuit or IC device may experience a relatively higher rate of clock skew). Accordingly, one of the embodiments provided herein includes calibration circuitry that may be used to reduce clock skew that may be associated with an unbalanced clock structure.

Figure 1A:
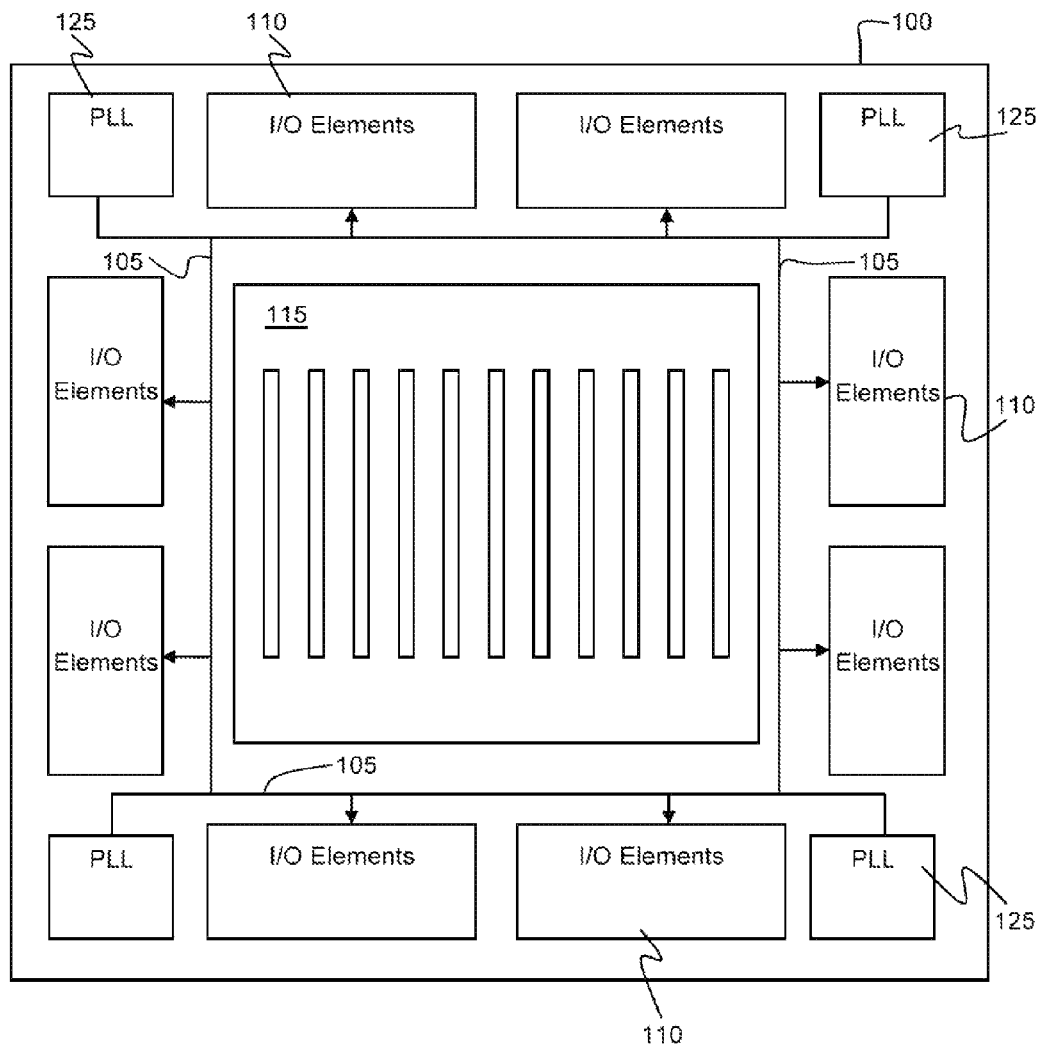
FIG. 1A is a simplified block diagram of an integrated circuit as one embodiment in accordance with the present invention.

FIG. 1A, meant to be illustrative and not limiting, shows a simplified block diagram of IC 100 that can implement embodiments of the present invention. IC 100 includes core logic region 115 and input-output elements 110. Other auxiliary circuits, such as phase-locked loops (PLLs) 125 for clock generation and timing, can be located outside the core logic region 115 (e.g., at corners of IC 100 and adjacent to input-output elements 110).

Core logic region 115 may be populated with logic cells that may include "logic elements" (LEs), among other circuits. LEs may include look-up table-based logic regions and may be grouped into "Logic Array Blocks" (LABs). The LEs and groups of LEs or LABs can be configured to perform logical functions desired by the user. Configuration data loaded into configuration memory can be used to produce control signals that configure the LEs and groups of LEs and LABs to perform the desired logical functions.

In the embodiment of FIG. 1A, input-output elements 110 may include input-output buffers that connect IC 100 to other external components. Signals from core region 115 may be transmitted through input-output elements 110 to external components that may be connected to IC 100. A single device like IC 100 can potentially support a variety of different interfaces and each individual input-output bank 110 can support a different input-output standard with a different interface or a different voltage level.

Accordingly, IC 100 may receive signals from external circuitry at input-output elements 110 and the signals may be routed from input-output elements 110 to core logic region 115 and other logic blocks on IC 100. Core logic region 115 and other logic blocks on IC 100 may perform functions based on the signals received. Signals may be sent from core logic region 115 and other relevant logic blocks of IC 100 to other external circuitry or components that may be connected to IC 100 through input-output elements 110.

In the embodiment of FIG. 1A, IC 100 may include clock network 105. It should be appreciated that clock network 105 may be used to transmit clock signals from clock circuits (e.g., PLLs 125) to various parts of IC 100. In one embodiment, clock network 105 may form a balanced clock tree on IC 100. In another embodiment, clock network 105 may be formed by different clock structures (e.g., a balanced H-tree clock tree and a fly-by clock structure) that extend from the clock circuits to different logic blocks on IC 100 (e.g., input-output elements 110). In one embodiment, input-output elements 110 (or any other logic blocks that may receive clock signals from clock network 105) may include calibration circuitry to calibrate clock signals received from clock network 105.

Figure 1B:
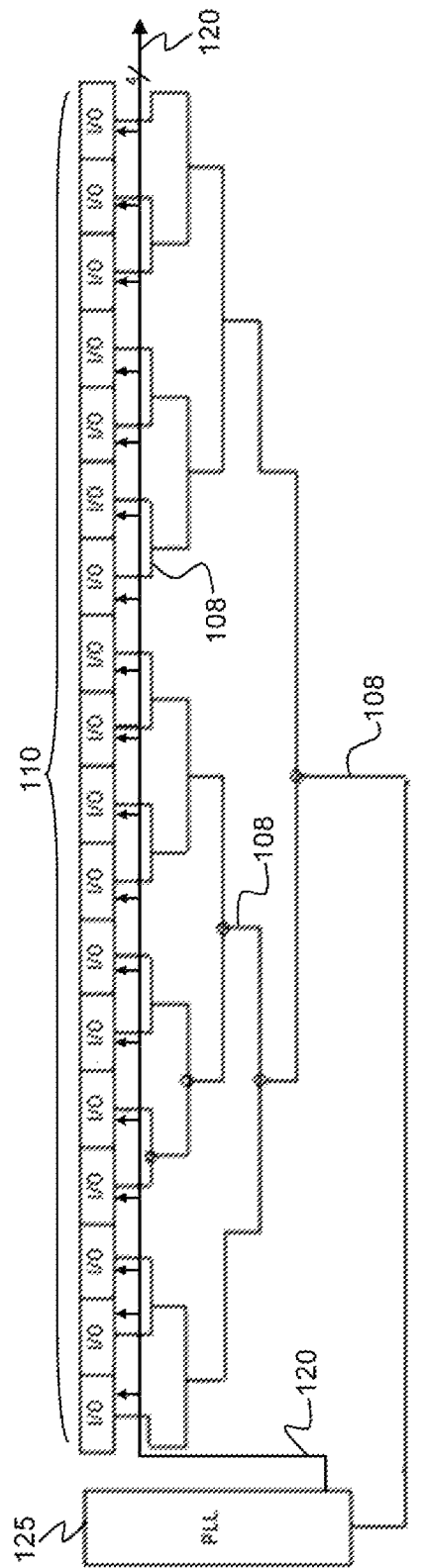
FIG. 1B shows illustrative input-output blocks coupled to receive clock signals from a PLL circuit through two clock structures as one embodiment in accordance with the present invention.

FIG. 1B shows illustrative input-output blocks 110 coupled to receive clock signals from PLL circuit 125 through clock structures 108 and 120 as one embodiment in accordance with the present invention. In one embodiment, PLL circuit 125 may be a clock circuit that may be used to provide clock signals for synchronizing signals between different logic elements in an IC device (e.g., IC device 100 of FIG. 1A).

In the embodiment of FIG. 1B, clock structure 108 may be a balanced clock structure and clock structure 120 may be an unbalanced clock structure. It should be appreciated that a balanced clock structure may include multiple clock paths, each of substantially equal lengths. In one embodiment, the unbalanced clock structure may be a fly-by clock structure. It should be appreciated that in a fly-by clock structure, clock routing paths from PLL circuit 125 may be coupled to each of input-output blocks 110 in a single path, chaining from one input-output block to another.

In the embodiment of FIG. 1B, PLL circuit 125 may generate different clock signals. In one embodiment, PLL circuit 125 may transmit a reference clock signal through clock structure 108 and multiple phase-shifted clock signals through clock structure 120. As the clock signals are transmitted through two different clock structures (e.g., clock structures 108 and 120), input-output blocks 110 may include calibration circuitry that may be used to calibrate the phase-shifted clock signals received from clock structure 120.

Figure 2:
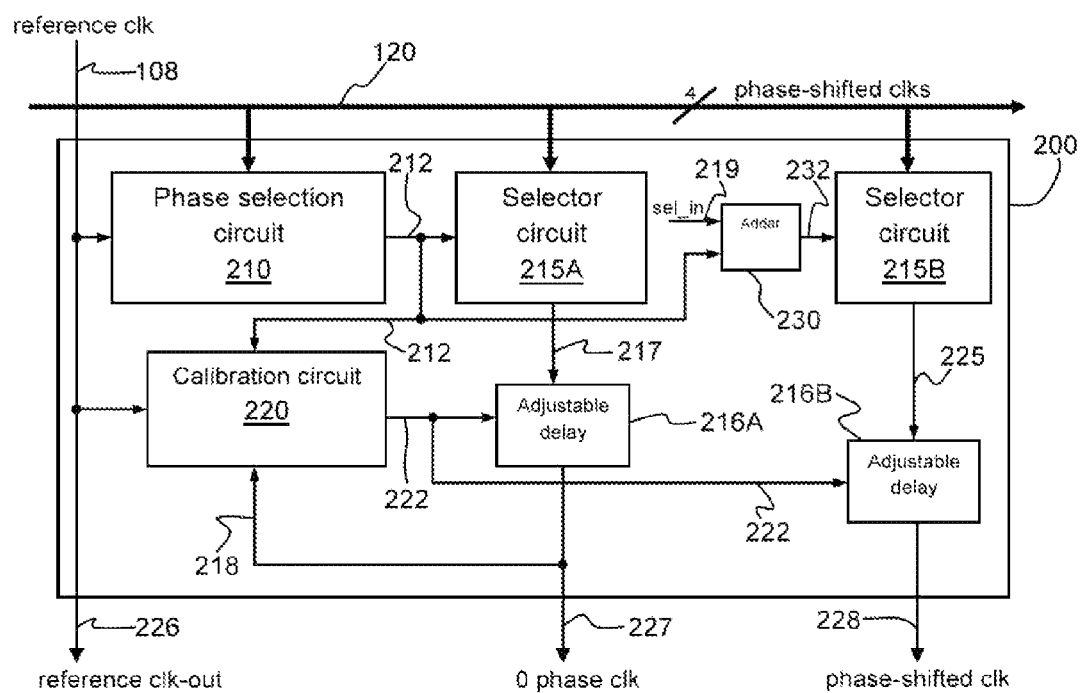
FIG. 2 shows an illustrative input-output block with calibration circuitry as one embodiment in accordance with the present invention.

FIG. 2 shows an illustrative input-output block 200 with calibration circuitry as one embodiment in accordance with the present invention. Input-output block 200 may be similar to input-output blocks 110 of FIGS. 1A and 1B, according to one embodiment. Input-output block 200 may receive a reference clock signal (e.g., reference clk) from clock structure 108 and multiple phase-shifted clock signals (e.g., phase-shifted clks) from clock structure 120. In one embodiment, four clock signals that are phase-shifted from each other may be transmitted through clock structure 120. The phase-shifted clock signals (phase-shifted clks) may be received by phase selection circuit 210, selector circuit 215A, and selector circuit 215B.

In one embodiment, phase selection circuit 210 may receive the clock signal, reference clk, and the different phase-shifted clock signals, phase-shifted clks, and may accordingly identify one of the phase-shifted clock signals based on the reference clock signal (e.g., reference clk). As an example, the reference clock signal may be a half-rate clock signal and the phase-shifted clock signals may be full-rate clock signals and phase selection circuit 210 may identify one of the full-rate clock signals with clock phases that substantially match the phases of the half-rate clock signal (e.g., reference clk).

Once phase selection circuit 210 identifies the appropriate clock signal from the multiple phase-shifted clock signals (e.g., phase-shifted clks), the identified clock signal may be transmitted as output 212 to selector circuit 215A. In one embodiment, selector circuit 215A may be a multiplexing circuit that receives the multiple phase-shifted clock signals and phase selection circuit 210 may output an appropriate select bit as output 212 to selector circuit 215A so that selector circuit 215A may output the identified clock signal. In one embodiment, phases of the identified clock signal may not fully match the phases of the reference clock signal received from clock structure 108. As such, calibration circuit 220 may be used to calibrate the identified clock signal such that its phases may be adjusted to match the phases of the reference clock signal.

In the embodiment of FIG. 2, selector circuit 215A may output the identified clock signal as output 217. The identified clock signal (e.g., output 217 of selector circuit 215A), may be received by adjustable delay circuit 216A. At this stage, the adjustable delay circuit 216A may not apply any delay to the identified clock signal at output 217. The output 218 of adjustable delay circuit 216A may be coupled to calibration circuit 220. In one embodiment, calibration circuit 220 may include circuitry to compare rising (or falling) edges of the identified clock signal from output 218 with the reference clock signal received from clock structure 108. In the embodiment of FIG. 2, calibration circuit 220 may further be coupled to receive output 212 from phase selection circuit 210. In one embodiment, a calibration process may only be enabled by calibration circuit 220 when an appropriate clock signal has been identified by phase selection circuit 210 (e.g., when output 212 from phase selection circuit 210 becomes stable or remains the same for subsequent clock cycles).

Based on the comparison between the reference clock signal and the identified clock signal (e.g., how close the phases of the identified clock signal are to the phases of the reference clock signal), an appropriate delay period may be determined by calibration circuit 220. Accordingly, adjustable delay circuit 216A may be configured to delay the identified clock signal based on the amount of delay (e.g., output 222) determined by calibration circuit 220. The adjusted clock signal may be transmitted as a zero-phase clock output (e.g., 0-phase clk 227).

In the embodiment of FIG. 2, input-output block 200 may also provide a phase-shifted clock signal based on the 0-phase clk output 227. Accordingly, another selector circuit 215B in input-output block 200 may receive the phase-shifted clock signals (e.g., phase-shifted clks) from clock structure 120. Selector circuit 215B may select another one of phase-shifted clks as an output 225 based on the identified clock signal (e.g., output 212) from phase selection circuit 210. An adder circuit 230 may be coupled to selector circuit 215B to provide the appropriate select bits to selector circuit 215B.

In one embodiment, adder circuit 230 may receive output 212 from phase selection circuit 210 and a select input (e.g., sel_in 219). It should be appreciated that sel_in 219 may be a user input or an input provided by another logic block (not shown) on the IC device. In one embodiment sel_in 219 may provide the amount of phase shift to be applied to the identified clock signal from output 212. Adder circuit 230 may provide an appropriate output 232 based on the identified clock signal, output 212, and sel_in 219.

Accordingly, selector circuit 215B may select another phase-shifted clock signal (e.g., a clock signal from phase-shifted clks that is phase-shifted by a specific number of degrees from the identified clock signal) as output 225. Output 225 that carries the phase-shifted clock signal may be coupled to another adjustable delay circuit 216B. In one embodiment, adjustable delay circuits 216A and 216B may include a chain of delay cells that may be configurable to delay their respective input signals based on the amount of delay (e.g., output 222) determined by calibration circuit 220. Input-output block 200 may thus provide a phase-shifted clock signal (e.g., phase-shifted clk 228) based on its selected clock signal (e.g., 0-phase clk output 227). In the embodiment of FIG. 2, input-output block 200 may provide three different clock outputs based on the different clock signals received from clock structures 108 and 120 (e.g., reference clk-out 226, 0-phase clk 227, and phase-shifted clk 228).

Figure 3:
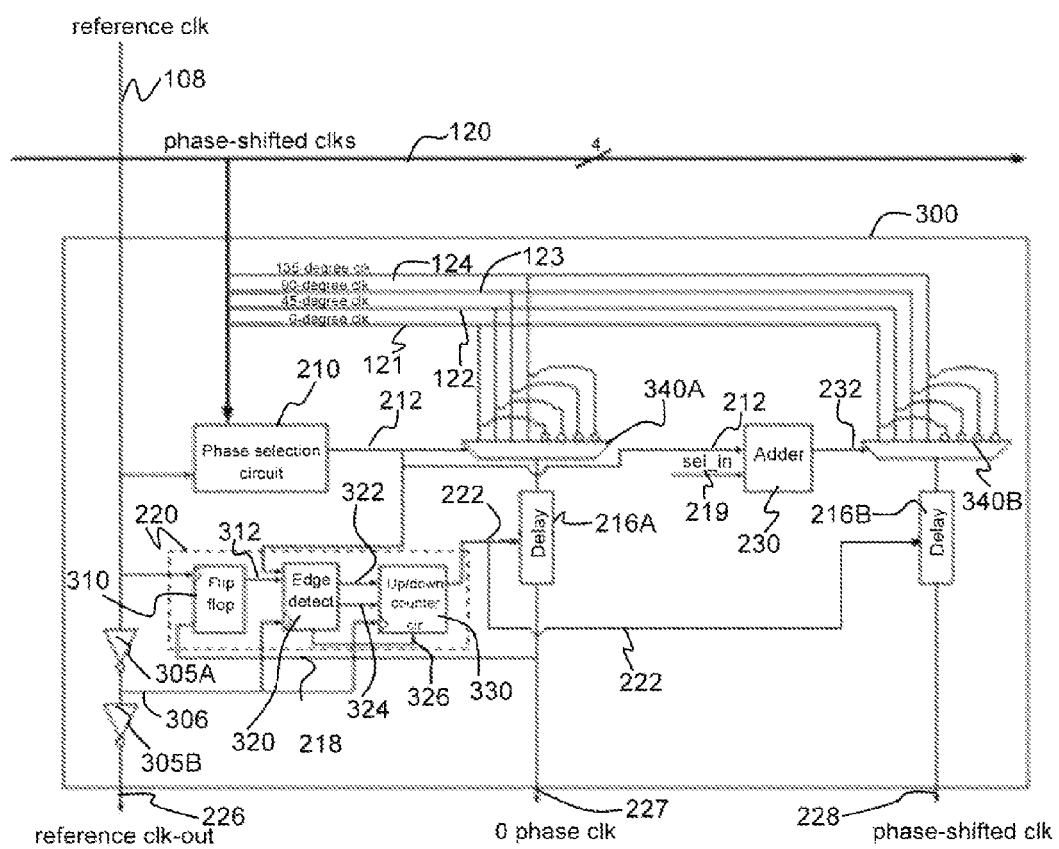
FIG. 3 shows a more detailed representation of an input-output block with a more detailed representation of a calibration circuit as one embodiment in accordance with the present invention.

FIG. 3 shows a more detailed representation of input-output block 300 with a more detailed representation of calibration circuit 220 as one embodiment in accordance with the present invention. It should be appreciated that input-output block 300 shares similarities with input-output block 200 of FIG. 2 and as such, for the sake of brevity, elements that have been described above will not be described in detail again. In the embodiment of FIG. 3, multiplexing circuits 340A and 340B may be similar to selector circuits 215A and 215B, respectively, of FIG. 2. Multiplexing circuits 340A and 340B may each have eight input terminals to receive the different phase-shifted clock signals from clock structure 120.

In the embodiment of FIG. 3, each of the four phase-shifted clock signals, phase-shifted clks, may be inverted to obtain an additional of four clock signals with four different phases. In one embodiment, the phase-shifted clock signals may include a 0-degree clock signal 121, a 45-degree clock signal 122, a 90-degree clock signal 123, and a 135-degree clock signal 124. Accordingly, each of the clock signals may be inverted to obtain an additional four phase-shifted clock signals, namely, a 180-degree clock signal, a 225-degree clock signal, a 270-degree clock signal, and a 315-degree clock signal. Accordingly, in one embodiment, multiplexing circuits 340A and 340B may each receive the eight different phases of the clock signal from clock structure 120.

Phase selection circuit 210, the details of which will be explained later in reference to FIG. 4A, may provide selection bits through output 212 to multiplexing circuit 340A. The selected clock signal (e.g., either one of the clock signals, namely, 0-degree clk, 45-degree clk, 90-degree clk, 135-degree clk, 180-degree clk, 225-degree clk, 270-degree clk, and 315-degree clk) may then be transmitted to delay circuit 216A. Delay circuit 216A may then apply an appropriate amount of delay to the selected clock signal based on the reference clock signal received from clock structure 108.

In one embodiment, the amount of delay to be applied by delay circuit 216A to the selected clock signal may be determined by calibration circuit 220. Accordingly, the delayed selected clock signal from delay circuit 216A may be transmitted to calibration circuit 220, and calibration circuit 220 may subsequently configure delay circuit 261A to align edges of the selected clock signal with the edges of the reference clock signal.

In the embodiment of FIG. 3, calibration circuit 220 may include flip flop circuit 310, edge detection circuit 320, and counter circuit 330. Edge detection circuit 320 and counter circuit 330 may be clocked by an inverted version of the reference clock signal (e.g., the clock terminal of each of the edge detection circuit 320 and counter circuit 330 may be coupled to receive the inverted version of the reference clock signal 306 from inverter circuit 305A).

Flip flop circuit 310 may be coupled to receive the reference clock signal at its clock input terminal. Flip flop circuit 310 may also be coupled to receive the selected clock signal from delay circuit 216A at its input terminal. As such, in one embodiment, a logic high level (e.g., logic level 1) at output 312 of flip flop circuit 310 may indicate that the selected clock signal from delay circuit 216A is ahead of the reference clock signal (e.g., positively offset from the reference clock signal). Conversely, a logic low level (e.g., logic level 0) at output 312 of flip flop circuit 310 may indicate that the selected clock signal from delay circuit 216A lags behind the reference clock signal (e.g., negatively offset from the reference clock signal).

Counter circuit 330 may be set to count up or down based on the output 312 from flip flop circuit 310. In the embodiment of FIG. 3, edge detection circuit 320 may be coupled between flip flop circuit 310 and counter circuit 330. Edge detection circuit 320 may be used to compare edges of the selected clock signal with edges of the reference clock signal. If they are not aligned, edge detection circuit may send a count-up or a count-down signal 322 to counter circuit 326. In one embodiment, edge detection circuit 320 may also transmit an enable signal 324 to enable or disable counter circuit 330.

As an example, counter circuit 330 may be enabled when enable signal 324 is at a logic high level, and may be disabled when enable signal 324 is at a logic low level. Edge detection circuit 320 may also transmit a clear signal 326 to clear counter circuit 330. In one embodiment, edge detection circuit 320 may receive select bits 212 from phase selection circuit 210 and may output a logic high clear signal to clear counter circuit 330 when select bits 212 are not stable. For instance, edge detection circuit 320 may compare the received select bits 212 with the select bits received at a previous clock cycle. If the received select bits 212 are not stable (e.g., the bits change over different clock cycles), counter circuit 330 may be cleared with clear signal 326.

Accordingly, counter circuit 330 may be enabled and may start counting (either up or down) based on the outputs (e.g., count-up/count-down signal 322, enable signal 324, and clear signal 326) from edge detection circuit 320. The count output 222 from counter circuit 330 may be used to configure delay circuit 216A such that an appropriate period of delay may be applied to the selected clock signal from the output of multiplexing circuit 340A. In one embodiment, counter circuit 330 may stop counting once the edges of the reference clock signal are aligned with edges of the selected clock signal. In the embodiment of FIG. 3, the adjusted clock signal may be transmitted as 0-phase clock output 227.

The count output 222 from counter circuit 330 may also be transmitted to delay circuit 216B. It should be appreciated that multiplexing circuit 340B may be used to select a phase-shifted clock signal based on the clock signal selected by phase selection circuit 210 and multiplexing circuit 340A. As such, the phase-shifted clock signal selected from multiplexing circuit 340B may be adjusted accordingly by delay circuit 216B (e.g., the same period of delay may be applied to the selected clock signal and the phase-shifted selected clock signal by delay circuits 216A and 216B, respectively). The adjusted phase-shifted clock signal may be transmitted as a phase-shifted clock signal (e.g., phase-shifted clk 228).

In one embodiment, phase-shifted clk 228 may be a phase-shifted clock signal based on 0-phase clk output 227. As shown in the embodiment of FIG. 3, adder circuit 230 may be coupled to receive select bits 212 from phase selection circuit 210 and a configurable select input (e.g., sel_in 219). The select bits 232 generated by adder circuit 230 may configure multiplexing circuit 340B to select a phase-shifted clock signal from the eight phase-shifted clock signals based on the clock signal selected by multiplexing circuit 340A. It should be appreciated that the reference clock signal received from clock structure 108 may be buffered (e.g., inverted circuits 305A and 350B) to generate reference clk-out signal 226. Accordingly, in the embodiment of FIG. 3, input-output block 300 may output three clock signals (e.g., reference clk-out 226, 0-phase clk 227, and phase-shifted clk 228).

Figures 4A, 4B:
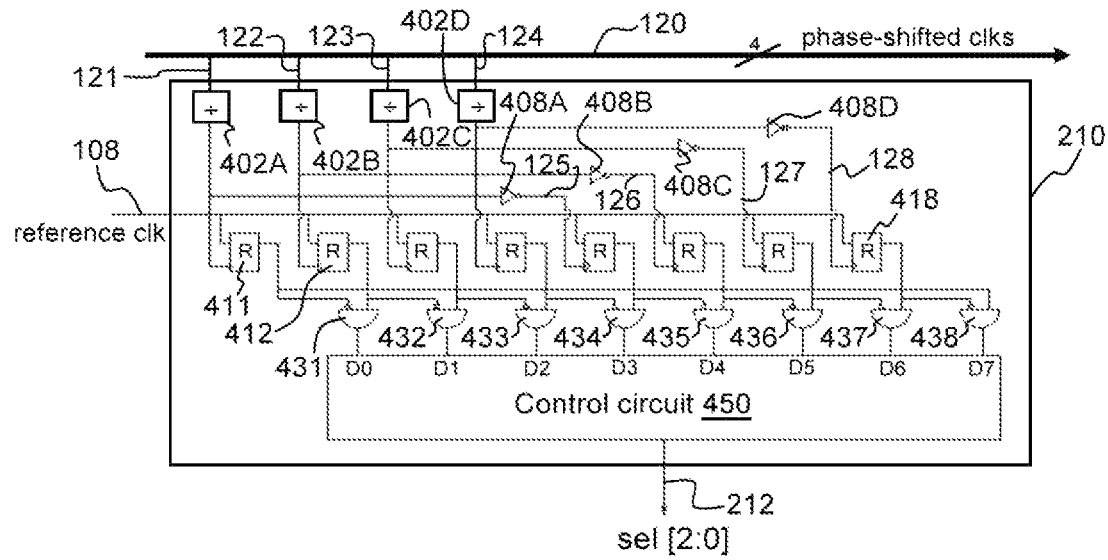
FIG. 4A shows a more detailed representation of a phase selection circuit that includes divider circuits, registers, logic circuits, and a decoder circuit.
FIG. 4B shows an illustrative truth table for an encoder circuit in accordance with one embodiment of the present invention.

FIG. 4A, meant to be illustrative and not limiting, shows a more detailed representation of phase selection circuit 210 that includes divider circuits 402A-402D, registers 411-418, logic circuits 431-438, and a decoder circuit 450. Phase selection circuit 210 may receive four phase-shifted clock signals (e.g., 0-degree clk, 45-degree clk, 90-degree clk, and 135-degree clk) from clock structure 120. In one embodiment, the clock signals may be divided by divider circuits 402A-402D respectively. It should be appreciated that the phase-shifted clock signals from clock structure 120 may be full-rate clock signals while the reference clock signal from clock structure 108 may be a half-rate clock signal, and as such, the full-rate phase-shifted clock signals may need to be divided so that edges of the signals may be appropriately compared with that of the half-rate reference clock signal.

In the embodiment of FIG. 4A, the divided clock signals may be inverted by inverter circuits 408A-408D, respectively, to produce additional clock signals with different phases. FIG. 4A shows clock signals with eight different phases coupled, respectively, to registers 411-418. In one embodiment, each of registers 411-418 may be coupled to receive the reference clock signal (e.g., reference clk) from clock structure 108 at its input terminal. Each of the registers (e.g., registers 411-418) may also be coupled to receive a corresponding phase-shifted clock signal at its clock input terminal. It should be appreciated that registers 411-418 may be used to compare edges of the reference clock signal with the edges of a corresponding phase-shifted clock signal.

In the embodiment of FIG. 4A, an output of each of registers 411-418 may be coupled to a corresponding logic circuit (e.g., logic circuits 431-438). It should be appreciated that logic circuits 431-438 are two-input AND gates. In one embodiment, the phase-shifted clock signals may be arranged in an ascending order according to their phases. As an example, the 0-degree clock signal may be coupled to the clock terminal of register 411, the 45-degree clock signal may be coupled to the clock terminal of register 412, the 90-degree clock signal may be coupled to the clock terminal of register 413, and so on and so forth. In one embodiment, each of the AND gates 431-438 is coupled to compare two adjacent phases of the phase-shifted clock signals.

As an example, in the embodiment of FIG. 4A, AND gate 431 may be coupled to receive the output from register 411 and the output from register 412, AND gate 432 may be coupled to receive the output from register 412 and register 413, and so on. In one embodiment, one of the inputs of the AND gates (e.g., AND gates 431-438) may be inverted. Accordingly, it should be appreciated that AND gates 431-438 may be used to identify a transition from one logic level to another between two adjacent clock phases. In one embodiment, the logic gates 431-438 may output a logic high level when there is a transition from one logic level to another (e.g., from a logic low level to a logic high level) between two adjacent clock phases.

A control circuit (e.g., control circuit 450) may be coupled to receive outputs from logic circuits 431-438. In one embodiment, control circuit 450 may be an encoder circuit. As such, control circuit 450 may generate appropriate encoding bits based on outputs of the logic circuits 431-438. Output 212 may transmit the encoding bits (e.g., sel[2:0]) from control circuit 450 to the select input of multiplexing circuit 340A of FIG. 3. Accordingly, it should be appreciated that the phase-shifted clock signals may be coupled to the appropriate input terminals on multiplexing circuit 340A so that the identified clock signal may be selected based on the encoding bits generated by control circuit 450.

FIG. 4B shows an illustrative truth table 490 for an encoder circuit (e.g., encoder circuit 450 of FIG. 4A) in accordance with one embodiment of the present invention. It should be appreciated that the encoder circuit may be an 8:3 encoder circuit. As such, the encoder circuit may be coupled to receive eight input signals at eight input terminals (e.g., D0-D7) and may produce a 3-bit output (e.g., sel[2:0]) based on the inputs received at terminals D0-D7 respectively.

In one embodiment, the encoder circuit may produce a 3-bit binary code that corresponds to the input signals received at the respective input terminals D0-D7. As an example, when the input signal received at input terminal D0 is at a logic high level and input signals received at the rest of the input terminals D1-D7 are at a logic low level, the encoder circuit may output a 3-bit binary code (e.g., 000) that corresponds to input terminal D0 (e.g., input terminal 0). Similarly, when the input signal received at input terminal D1 is at a logic high level the encoder circuit may output a 3-bit binary code (e.g., 001) that corresponds to input terminal D1 (e.g., input terminal 1).

Truth table 490 shows the encoding bits generated by the encoder circuit based on the signals received at different input terminals (e.g., D0-D7). It should be appreciated that truth table 490 may represent an 8:3 encoder circuit. It should also be appreciated that an 8:3 encoder circuit may be used as the encoder circuit may be coupled to receive a total of eight phase-shifted clock signals. Accordingly, a different encoder circuit (e.g., one with fewer or more bits) may be used depending on the number of clock signals (e.g., the total number of phases) to be selected from.

Figure 5:
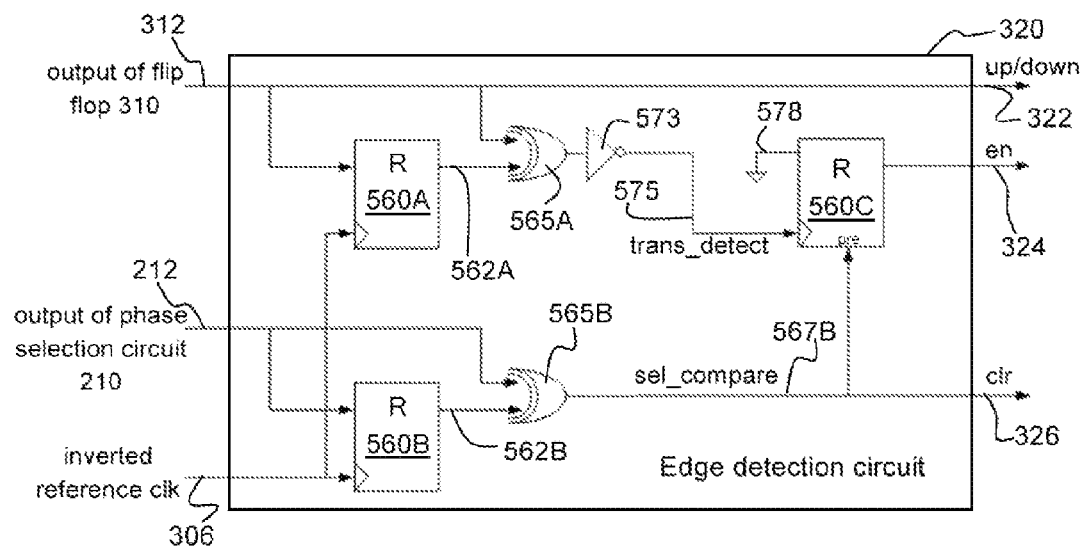
FIG. 5 shows an illustrative edge detection circuit as one embodiment in accordance with the present invention.

FIG. 5 shows illustrative edge detection circuit 320 as one embodiment in accordance with the present invention. Edge detection circuit 320 may include three registers 560A-560B, and two XOR circuits 565A and 565B. In the embodiment of FIG. 3 edge detection circuit 320 may be coupled to receive output 212 from phase selection circuit 210, output 312 of flip flop 310, and the inverted version of the reference clock signal 306 from inverter circuit 350A. Accordingly, registers 560A and 560B may be clocked by the inverted version of the reference clock signal 306 (e.g., clock signal 306 may be coupled to the clock input terminals of registers 560A and 560B). Register 560B may be coupled to receive output 212 (e.g., select bits) from phase selection circuit 210 of FIG. 3 and XOR circuit 565B may be coupled to receive the same signal (e.g., output 212) and output 562B from register 560B. As such, in one embodiment, XOR circuit 565B may determine if output 212 is stable over subsequent clock cycles.

If output 212 is not stable (e.g., if output 212 changes at the next clock cycle), sel_compare signal 567B may be placed at a logic high level (e.g., logic level 1). Accordingly, register 560C, which may have a present input coupled to receive sel_compare signal 567B, is set to a logic high level. In one embodiment, when register 560C is preset (e.g., the preset input of register 560C receives a logic high level), register 560C may output a logic high level. As such, when sel_compare signal 567B is at a logic high level, a logic high level is transmitted through outputs of edge detection circuit 320. Accordingly, counter 330 of FIG. 3, which may be coupled to receive en signal 324 and clr signal 326, may be enabled and cleared (as en signal 324 and clr signal 326 may both be at a logic high level) when sel_compare signal 567B is at a logic high level (e.g., when output 212 is not stable).

When output 212 is stable (e.g., if output 212 remains the same at subsequent clock cycles), sel_compare signal 567B may be placed at a logic low level (e.g., logic level 0). Accordingly, register 560C is not preset and counter 330 of FIG. 3 is not cleared (as clr signal 326 is at a logic low level). As such, the counter (e.g., counter 330 of FIG. 3) may be enable and disabled accordingly based on the signal received from output 312 of flip flop 310. As described above in reference to FIG. 3, if output 312 of flip flop circuit 310 is at a logic high level (e.g., logic level 1), the selected clock signal from delay circuit 216A may be ahead of the reference clock signal (e.g., positively offset from the reference clock signal). As such, counter circuit 330 needs to count up (e.g., to apply more delay to the selected clock signal) to align both clock signals. If output 312 of flip flop circuit 310 is at a logic low level (e.g., logic level 0), the selected clock signal from delay circuit 216A may lag behind the reference clock signal (e.g., negatively offset from the reference clock signal) and counter circuit 330 needs to count down to align both clock signals.

In the embodiment of FIG. 5, up/down signal 322 is set to a logic high level to configure the counter circuit (e.g., counter circuit 330 of FIG. 3) to count up and is set to a logic low level to configure the counter circuit to count down. As register 560C has been preset earlier (e.g., when sel_compare signal 567B is not stable), register 560C may continue to output a logic high level (e.g., en signal 324) to enable the counter circuit to count either up or down, depending on up/down signal 322. The counter circuit (e.g., counter circuit 330) may be disabled when a transition at output 312 of flip flop circuit 310.

In the embodiment of FIG. 5, XOR circuit 565A may be used to detect a transition (e.g., transition between one logic level to another at a subsequent clock cycle) at output 312 of flip flop circuit 310. As an example, when output 312 of flip flop 310 is at a logic high level (e.g., the selected clock signal is positively offset from the reference clock signal), the counter circuit may be configured to count up through up/down signal 322. In this scenario, the counter circuit may continue to count up until a transition is detected by XOR circuit 565A (e.g., output 312 switches from the logic high level to a logic low level at the next clock cycle). At this point, XOR circuit 565A may receive a logic low level from output 312 of flip flop circuit 310 and a logic high level from output 562A of register 560A.

As such, trans_detect signal 575 may be placed at a logic high level and register 560C may be enabled (as the clock terminal of register 560C may be coupled to receive trans_detect signal 575). It should be appreciated that an active-hi clock terminal may be used in register 560C in the embodiment of FIG. 5 and when a transition is detected, register 560C may transmit the signal at its input terminal (e.g., input terminal 578) as an output. In the embodiment of FIG. 5, input terminal 578 may be coupled to a logic low level (e.g., a ground potential) and as such, en signal 324 may be set to a logic low level to disable the counter circuit (e.g., counter circuit 330 of FIG. 3). Accordingly, the counter circuit may be disabled when a transition is detected or when edge detection circuit 320 determines that both of the selected clock signals and the reference clock signals are aligned. In the embodiment of FIG. 3, an appropriate delay (based on the count from counter circuit 330) may be applied by delay circuit 216A to the selected clock signal from multiplexing circuit 340A in order to generate a 0-phase clock output (e.g., 0-phase clk 227).

Figure 6A:
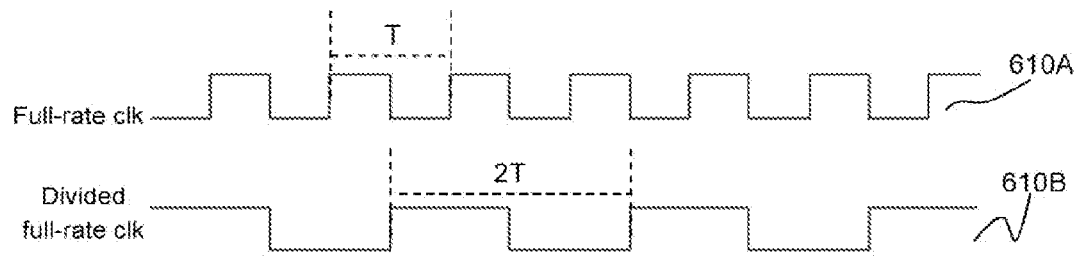
FIG. 6A shows illustrative waveforms for a full-rate clock signal and a corresponding half-rate clock signal in accordance with one embodiment of the present invention.

FIG. 6A shows exemplary waveform 610A for a full-rate clock signal and waveform 610B for a corresponding half-rate clock signal (e.g., a divided full-rate clock signal) in accordance with one embodiment of the present invention. In one embodiment, the full-rate clock signal may represent any one of the full-rate phase shifted clock signals from clock structure 120 of FIG. 4A. In the embodiment of FIG. 4A, each of the full-rate phase-shifted clock signals may be divided by divider circuits 402A-402D, respectively and waveform 610B may represent any of the divided clock signals. In one embodiment, the reference clock signal from clock structure 108 as shown in the illustrative embodiments of FIGS. 1B, 2, 3, and 4A, may be a half-rate (e.g., half the rate of the phase-shifted clock signals from clock structure 120) clock signal. In one embodiment, the full-rate clock signal (as represented by waveform 610A) may be divided by 2 to generate a half-rate clock signal (represented by waveform 610B). Accordingly, as an example, the period of a clock cycle of the full-rate clock may be T and the period of a clock cycle of the half-rate clock signal (e.g., the divided full-rate clock signal) may be 2T.

Figure 6B:
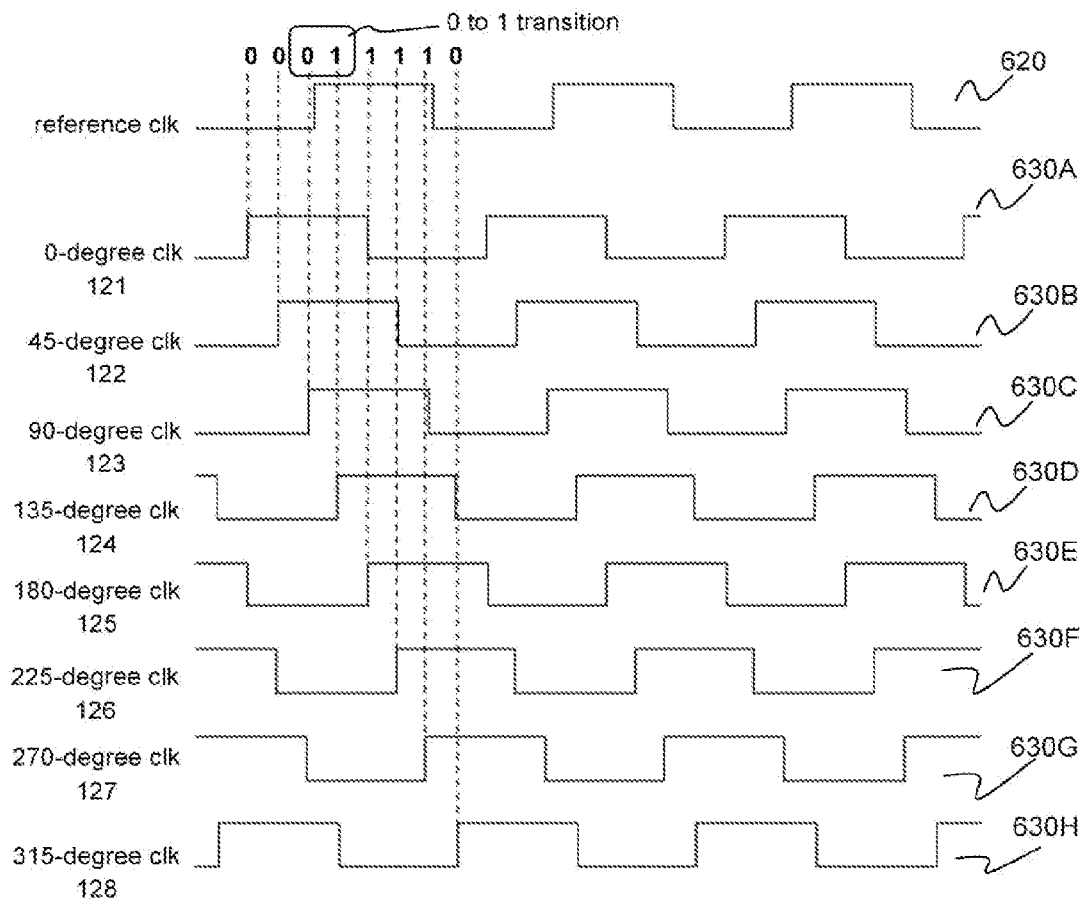
FIG. 6B shows an illustrative waveform of a reference clock signal and illustrative waveforms of multiple phase-shifted clock signals in accordance with one embodiment of the present invention.

FIG. 6B shows exemplary waveform 620 of a reference clock signal (e.g., reference clock signal from clock structure 108 of FIG. 4A) and waveforms 630A-630H of multiple phase-shifted clock signals in accordance with one embodiment of the present invention. In the embodiment of FIG. 4A, the reference clock signal may be coupled to each of the input terminal of registers 411-418. Each of the registers (e.g., registers 411-418) may also be coupled to receive the respective phase-shifted clock signals 121-128. In one embodiment, registers 411-418 of FIG. 4A may be flip flops and as such, the input signal (e.g., the reference clock signal) coupled to registers 411-418 may be captured at every transition edge of the clock signals (e.g., phase-shifted clock signals 121-128) coupled to the respective clock terminals of registers 411-418.

The respective outputs of registers 411-418 of FIG. 4A are shown in the illustrative embodiment of FIG. 6B. The value (or logic level) of the reference clock signal is captured at rising edges of the respective phase-shifted clock signals 121-128 (as represented by waveforms 630A-630H). As shown by the dotted lines in FIG. 6B, a logic high value or a logic low value may be captured and outputted by the registers, depending on how the edges (e.g., the rising edges) of the respective phase-shifted clock signals are aligned with the pulses of the reference clock signal (as represented by waveform 620). The outputs of the registers may be compared to determine which of the phase-shifted clock signals (e.g., phase-shifted clock signals 121-128 of FIG. 4A) is closely aligned with the reference clock signal (e.g., the reference clock signal from clock structure 108).

In the embodiment of FIG. 4A, logic circuits 431-438 may be used to determine which two adjacent phases of the phase-shifted clock signals capture the transitions of the reference clock signal. As an example, logic circuits 431-438 may be used to identify the rising edges of the reference clock signal (e.g., transitions from a logic low level to a logic high level). Once a transition is detected, or when a phase-shifted clock signal captures a logic low level and its subsequent phase-shifted clock signal captures a logic high level, the corresponding logic circuit that is coupled to the two adjacent registers may output a logic high level. In the embodiment of FIG. 6B, the rising edges of the waveform 630C of the third phase-shifted clock signal and the rising edges of the waveform 630D of the fourth phase-shifted clock signal are aligned, respectively, with low and high pulses of the reference clock signal (as represented by waveform 620).

Accordingly, the third phase-shifted clock signal may have rising edges that are most closely aligned with the rising edges of the reference clock signal. As such, the third phase-shifted clock signal (in this example, a 90-degree phase-shifted clock signal 123), may be identified as the selected clock signal. In the embodiment of FIG. 4A, logic circuit 433 may output a logic high level, and based on the truth table in FIG. 4B, control circuit 450 may generate a three-bit output (e.g., 010) that may be used as select bits for multiplexing circuit 340A of FIG. 3. Multiplexing circuit 340A of FIG. 3 may then output the appropriate phase-shifted clock signal (in this example, the 90-degree clock signal 123) as the selected clock signal output.

Figure 7:
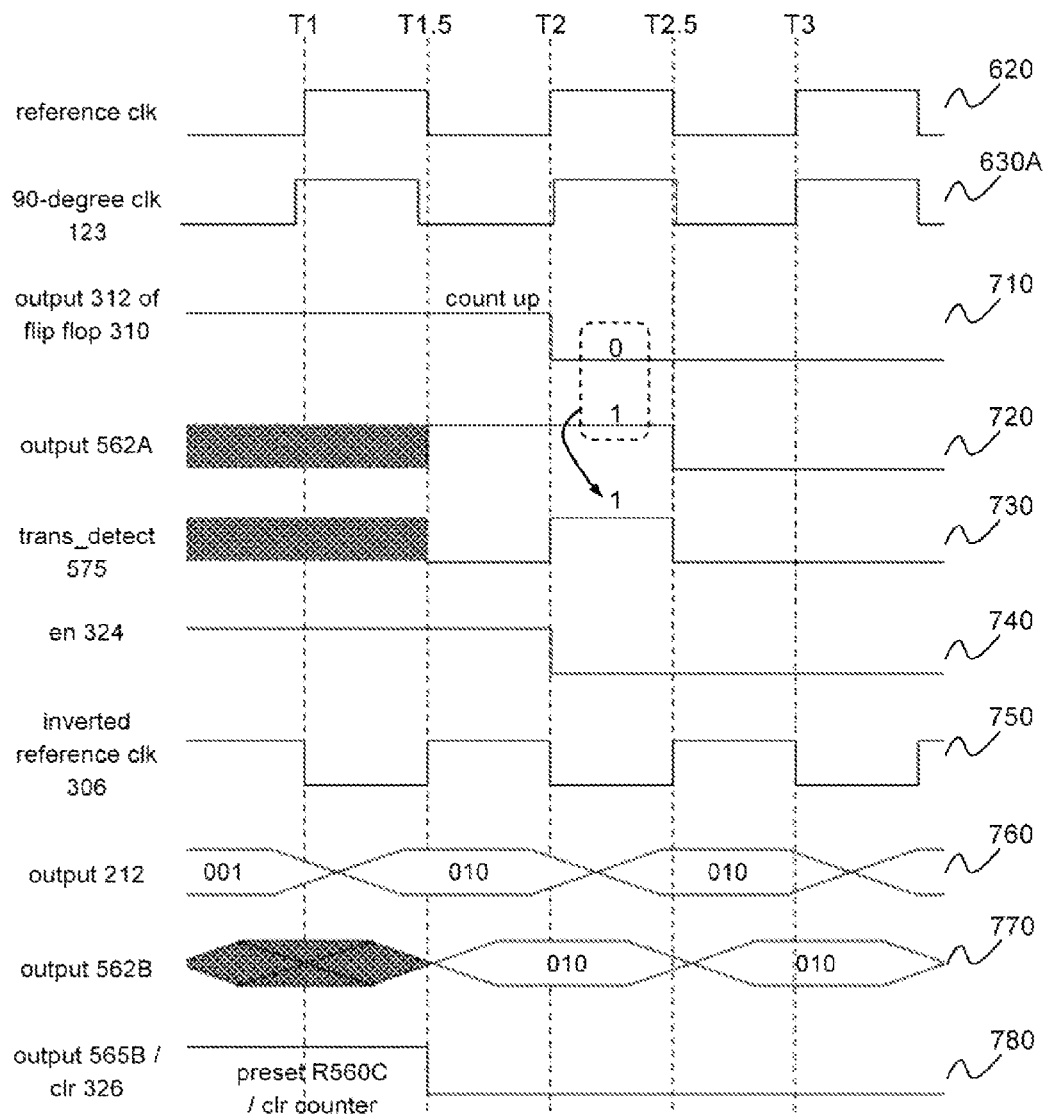
FIG. 7 shows illustrative output waveforms of an edge detection circuit in accordance with one embodiment of the present invention.

FIG. 7 shows illustrative output waveforms of an edge detection circuit (e.g., edge detection circuit 320 of FIG. 5) in accordance with one embodiment of the present invention. It should be appreciated that the waveforms shown in FIG. 7 may be described in reference to edge detection circuit 320 of FIG. 5. As shown in the embodiment of FIG. 3, flip flop circuit 310 may generate an output based on the selected clock signal from multiplexing circuit 340A and the reference clock signal from clock structure 108. When the rising edges of the reference clock signal (as shown by waveform 620) coincides with the high pulses (e.g., pulses at the logic high level) of the selected clock signal (e.g., 90-degree clock signal 123 represented by waveform 630C) at time T1, output 312 of flip flop 310 goes high (as shown by waveform 710). In one embodiment, a count-up signal is asserted and sent (e.g., through output 322 of edge detection circuit 320) to a counter circuit to configure the counter circuit to count up when output 312 is at a logic high level.

As an example, counter circuit 326 of FIG. 3 may be set to count up based on the count-up or count-down signal from output 322 of edge detection circuit 320. However, counter circuit 326 may not be enabled until output 212 (as shown by waveform 770) from phase selection circuit 210 is stable. As shown in FIG. 7, a clear signal may be asserted by output 326 to clear the counter circuit when output 212 (e.g., the select bits for multiplexing circuit 340A or the current select bits) from phase selection circuit 210 is different from its previous output (e.g., as captured by register 560B). As such, the counter circuit may not start counting before output 212 is stable (or when both output 212 and the output 562B from register 560B, as shown by waveforms 770 and 780 respectively, are similar).

At time T1.5, when output 212 from phase selection circuit 210 is stable (e.g., when output 212 and output 562B remain the same over subsequent clock cycles), output 565B may transition to a logic low level, as shown by waveform 780 in FIG. 7. Accordingly, at time T1.5, register 560C may no longer in a preset mode (as output 565B is low, preset input of 560C may not be asserted). Register 560C may then be controlled by its clock input signal (e.g., trans_detect signal 575). However, at time T1.5, trans_detect signal 575 may be at a low logic level (as shown by waveform 730), as no transition is detected at output 312 (e.g., output 562A is at a logic high level), register 560C is not activated by its clock input signal. As such, register 560C may continue to output a logic high level (its previous preset value). Accordingly, en signal 324 stays at a logic high level and the counter circuit (e.g., counter circuit 330 of FIG. 3) may be set to count up based on output 312 at time T1.5.

At time T2, output 312 may transition to a logic low level as the selected clock signal (e.g., 90-degree clock signal 123) may be lagging behind the reference clock signal after the delay is applied to the selected clock signal by the counter circuit. Output 562A (as shown by waveform 720) remains at a logic high level as register 560A, which may be clocked by the inverted reference clock signal 306 (as shown by waveform 750), may only capture the new value of output 312 at the next rising edge of the inverted reference clock signal 306 (e.g., at time T2.5). As output 312 and output 562A are both at different logic levels at time T2 (as shown in FIG. 7), trans_detect signal 575 may transition to a logic high level. As such, register 560C may capture the signal tied to its input terminal (e.g., a logic low level). Accordingly, at time T2, output en 324 transitions to a logic low level (as shown by waveform 740) to disable the counter circuit. However, it should be appreciated that in the embodiment of FIG. 3, counter circuit 330 may be clocked by the inverted reference clock signal 306 and as such, counter circuit 330 may only be disabled (or configured to stop counting) at time T2.5.

At time T2.5, output 312 remains at a logic low level and output 562A transitions to a logic low level. As such, trans_detect signal 575 may accordingly transition to a logic low level (as both outputs 312 and 562A are at the same logic level). As the clock input signal (e.g., trans_detect signal 575) of register 560C is at a logic low level, register 560C may continue to output a logic low level. Thus, enable signal, en 324, remains at a logic low level and the counter circuit may be disabled at time T2.5. In the embodiment of FIG. 7, the calibration operation may be fully performed (e.g., the selected clock signal is fully aligned with the reference clock signal) at time T2.5 and as such, the output signals (e.g., output 562A, trans_detect 575, enable signal 324, output 326, etc.) may remain unchanged at time T3.

Figure 8:
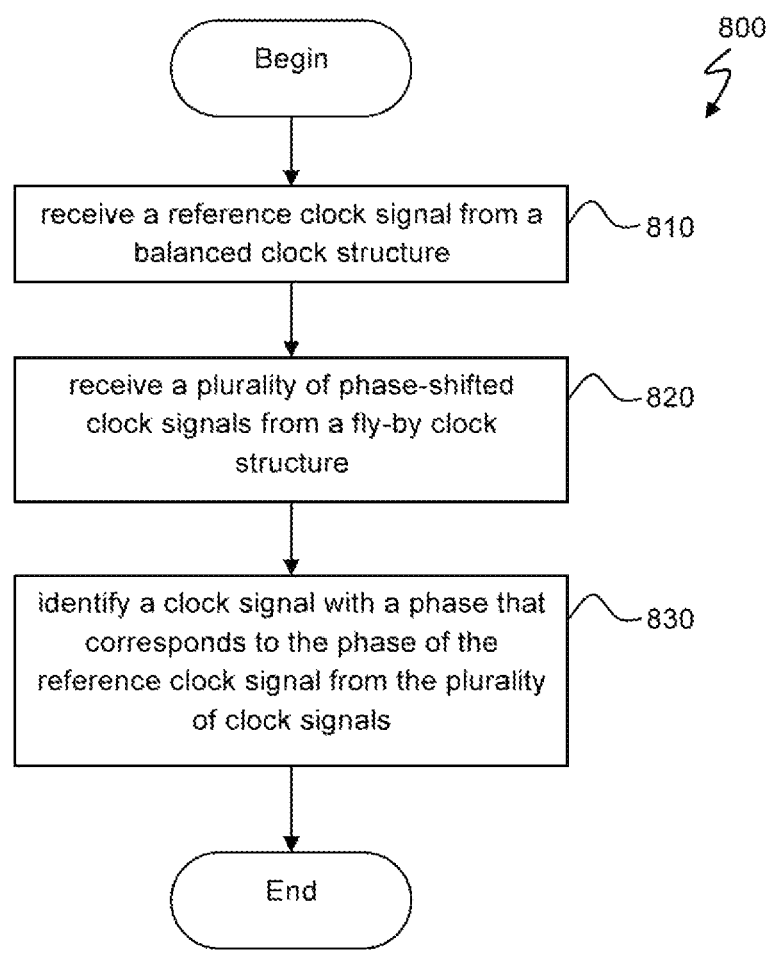
FIG. 8 shows a simplified flow for operating an integrated circuit as one embodiment in accordance with the present invention.

FIG. 8 shows simplified flow 400 for operating an IC as one embodiment in accordance with the present invention. At step 810, a reference clock signal is received from a balanced clock structure (e.g., the reference clock signal from clock structure 108 as shown in FIG. 1B). At step 820, a plurality of phase-shifted clock signals may be received from a fly-by clock structure. In the embodiment of FIG. 1B, the phase-shifted clock signals are received from fly-by clock structure 120. At step 830, a clock signal that has a phase that corresponds to the phase of the reference clock signal is identified. The clock signal may be selected from the plurality of phase-shifted clock signals.

In one embodiment, the identified or selected clock signal may be calibrated by a calibration circuit (e.g., calibration circuit 220 of FIG. 2) based on the phase of the reference clock signal received from the balanced clock structure. It should be appreciated that the calibration may include applying an appropriate period of delay (e.g., by configuring a counter circuit to either count up or down) to the identified clock signal in order to align its edges with the edges of the reference clock signal. In the embodiment of FIG. 2, a phase-shifted clock signal (e.g., phase-shifted clk 228) may be generated by applying the same amount of delay to another clock signal that is phase-shifted from the identified clock signal.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. An integrated circuit comprising:
a clock circuit that provides a plurality of clock signals;
a plurality of input-output circuits;
a first clock structure having a plurality of clock paths of substantially equal lengths, wherein the plurality of clock paths conveys a first subset of the plurality of clock signals to the plurality of input-output circuits; and
a second clock structure having a fly-by clock path, wherein the fly-by clock path transmits a second subset of the plurality of clock signals to the plurality of input-output circuits.

2. The integrated circuit defined in claim 1, wherein the first clock structure comprises an H-tree clock structure.

3. The integrated circuit defined in claim 1, wherein the first subset of clock signals comprises a reference clock signal and wherein each clock signal of the second subset of clock signals is phase shifted from a subsequent clock signal of the second subset of clock signals.

4. The integrated circuit defined in claim 3, wherein each input-output circuit of the plurality of input-output circuits comprises:
a phase selection circuit that receives the reference clock signal and the second subset of clock signals, wherein the phase selection circuit selects a clock signal from the second subset of clock signals based on a phase of the reference clock signal.

5. The integrated circuit defined in claim 4, wherein each input-output circuit of the plurality of input-output circuits further comprises:
a calibration circuit that calibrates the selected clock signal based on the reference clock signal to provide a full-rate reference clock signal.

6. The integrated circuit defined in claim 5 wherein the reference clock signal comprises a half-rate reference clock signal, the integrated circuit further comprising:
- an adjustable delay circuit that provides an adjustable delay for the selected full-rate clock signal, wherein the calibration circuit controls the adjustable delay of the adjustable delay circuit to align a phase of the selected full-rate clock signal to the phase of the half-rate reference clock signal.

7. The integrated circuit defined in claim 3, wherein the reference clock signal comprises a half-rate reference clock signal and wherein the second subset of clock signals comprises a plurality of full-rate clock signals.

8. The integrated circuit defined in claim 7, wherein the phase selection circuit comprises:
- a frequency divider circuit that generates a plurality of half-rate clock signals from the plurality of full-rate clock signals;
- a plurality of flip-flop circuits, wherein each flip-flop circuit of the plurality of flip-flop circuits receives the half-rate reference clock signal and is clocked by a corresponding half-rate clock signal of the plurality of half-rate clock signals; and
- a plurality of logic circuits, wherein each logic circuit receives first and second half-rate clock signals of the plurality of half-rate clock signals, wherein each logic circuit of the plurality of logic circuits produces an output signal that identifies whether the first and second half-rate clock signals received by that logic circuit are substantially phase-aligned.

9. The integrated circuit defined in claim 8, wherein the phase selection circuit further comprises:
- a control circuit that receives the output signals from the plurality of logic circuits and produces control signals that identify the selected clock signal from the second subset of clock signals.

10. The integrated circuit defined in claim 9 further comprising:
- a first multiplexing circuit that receives the plurality of full-rate clock signals from the fly-by clock path, and outputs the selected full-rate clock signal based on the control signals from the control circuit;
- a second multiplexing circuit that receives the plurality of full-rate clock signals from the fly-by clock path and selects a full-rate clock signal from the plurality of full-rate clock signals based at least partly on the control signals from the control circuit.

11. An integrated circuit comprising:
- a first clock network that conveys a reference clock signal;
- a second clock network that conveys a plurality of phase-shifted clock signals;
- a selection circuit that receives the reference clock signal from the first clock network and a plurality of phase-shifted clock signals from the second clock network, wherein the selection circuit selects a phase-shifted clock signal from the plurality of phase-shifted clock signals based on the reference clock signal; and
- a calibration circuit that receives the selected phase-shifted clock signal from the selection circuit and aligns rising edges of the selected phase-shifted clock signal with rising edges of the reference clock signal to output a zero phase clock signal.

12. An integrated circuit comprising:
- a first clock network that conveys a reference clock signal;
- a second clock network that conveys a plurality of phase-shifted clock signals; and
- a selection circuit that receives the reference clock signal from the first clock network and a plurality of phase-shifted clock signals from the second clock network, wherein the selection circuit selects a phase-shifted clock signal from the plurality of phase-shifted clock signals based on the reference clock signal, wherein the first clock network comprises a balanced clock topology, and wherein the second clock network comprises a fly-by clock topology.

13. The circuit defined in claim 11, wherein the selection circuit comprises:
- a plurality of flip flops, wherein each flip flop of the plurality of flip flops is clocked by a corresponding phase-shifted clock signal of the plurality of phase-shifted clock signals and receives the reference clock signal as an input; and
- a plurality of logic circuits coupled to receive outputs from every two adjacent flip flops of the plurality of flip flops, wherein the plurality of logic circuits identifies the selected phase-shifted clock signal of the plurality of phase-shifted clock signals having transition edges that are substantially aligned with transition edges of the reference clock signal.

14. The circuit defined in claim 11, wherein the calibration circuit comprises:
- a delay circuit that delays the selected phase-shifted clock signal in order to align the rising edges of the selected phase-shifted clock signal with the rising edges of the reference clock signal.

15. The circuit defined in claim 14, wherein the calibration circuit further comprises:
- a flip flop that receives the selected phase-shifted clock signal as an input and is clocked by the reference clock signal;
- a counter that counts up and down based on an output from the flip flop, wherein an output of the counter configures the delay circuit; and
- an edge detection circuit coupled between the flip flop and the counter, wherein the edge detection circuit disables the counter when transition edges of the selected phase-shifted clock signal are aligned with transition edges of the reference clock signal.

16. A method of operating circuitry on an integrated circuit, the method comprising:
- with the circuitry, receiving a reference clock signal from a balanced clock structure;
- with the circuitry, receiving a plurality of clock signals from a fly-by clock structure, wherein each clock signal of the plurality of clock signals has a respective phase that is phase shifted from a subsequent clock signal of the plurality of clock signals; and
- with the circuitry, identifying a clock signal from the plurality of clock signals having a phase that corresponds to a phase of the reference clock signal.

17. The method defined in claim 16, wherein the reference clock signal comprises a half-rate clock signal, the method further comprising:
- with the circuitry, calibrating the identified clock signal based on the phase of the half-rate clock signal to generate a calibrated zero phase clock signal.

18. The method defined in claim 17, wherein the calibrating comprises:
- applying a delay to the identified clock signal to align edges of the identified clock signal with edges of the half-rate clock signal;
- selecting another clock signal of the plurality of clock signals; and applying the delay to the another clock signal to generate a phase-shifted version of the calibrated zero phase clock signal.

19. The method defined in claim 18, wherein the applying the delay comprises:
   comparing the selected clock signal with the half-rate clock signal;
   increasing a counter when the selected clock signal is ahead of the half-rate clock signal; and
   decreasing the counter when the half-rate clock signal is ahead of the selected clock signal.

20. The integrated circuit defined in claim 1 wherein the input-output circuits interface between the integrated circuit and circuitry external to the integrated circuit.

\* \* \* \* \*